United States Patent
Smith et al.

(10) Patent No.: US 6,400,252 B1
(45) Date of Patent: Jun. 4, 2002

(54) POLYSILICON RESISTOR AND A METHOD OF PRODUCING IT

(75) Inventors: Ulf Smith, Huddinge; Matts Rydberg, Uppsala, both of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/503,484

(22) Filed: Feb. 14, 2000

(30) Foreign Application Priority Data

Nov. 13, 1998 (SE) ............................................. 9803883
Nov. 15, 1999 (WO) ............................. PCT/SE99/02092

(51) Int. Cl.[7] ............................................. H01C 1/012
(52) U.S. Cl. ...................... 338/308; 338/309; 438/210; 438/239
(58) Field of Search ................................. 338/307, 308, 338/309; 438/210, 239, 246, 247

(56) References Cited

U.S. PATENT DOCUMENTS 4,302,763 A * 11/1981 Ohuchi et al. ................. 357/16
4,758,814 A * 7/1988 Howng et al. ................ 338/34
5,241,206 A * 8/1993 Lee et al. ..................... 257/380
5,688,724 A * 11/1997 Yoon et al. ................... 437/235

FOREIGN PATENT DOCUMENTS

WO   WO 97/10606    3/1997
WO   WO 97/49103    12/1997

* cited by examiner

Primary Examiner—Elvin Enad
Assistant Examiner—Kyung S. Lee
(74) Attorney, Agent, or Firm—Nixon & Vanderhye P.C.

(57) ABSTRACT

A resistor has a resistor body of polycrystalline silicon and electric contact regions arranged on and/or in the resistor body, so that a resistor part is formed between the contact regions, which gives the resistor its resistance. The material in the resistor body is doped with for example boron to define its resistance. To give the resistor a good long term stability the resistor part is protected by one or more oxide based blocking layers produced from transition metals. These blocking layers can prevent movable kinds of atoms such as hydrogen from reaching the unsaturated bonds in the polysilicon. Such movable kinds of atoms can for example exist in passivation layers located outermost in an integrated electronic circuit in which the resistor is included. The blocking layers can be produced from layers having 30% titanium and 70% tungsten, which are oxidized using hydrogen peroxide.

20 Claims, 8 Drawing Sheets

POLYSILICON RESISTOR AND A METHOD OF PRODUCING IT

TECHNICAL FIELD

The invention generally relates to electronic components, primarily electronic components which are included in electronic integrated circuits or are produced using the corresponding processing methods, and in particular to electric resistors of polycrystalline silicon, germanium or silicon-germanium, and to a method of manufacturing such resistors.

BACKGROUND OF THE INVENTION AND STATE OF THE ART

Resistors of polycrystalline silicon, also called polysilicon, have been used in the electronic circuit field for about thirty years. Methods of manufacturing polycrystalline silicon are well-known, as are methods of manufacturing resistors from polycrystalline silicon. It is also previously known how it is possible, by adding dopants, to control the resistivity of the polysilicon to a desired value. The general technology is described in the book "Poly Silicon for Integrated Circuit Applications" by T. Kamins, ISBN 0-89838-259-9, Kluver Academic Publishers, 1988.

In analog electronic circuits the requirements of stability of included resistors are extremely high: both the specifications in regard of largest allowable change of the absolute value of the resistance must be fulfilled, and possible changes of the resistances of resistors, which are matched to each other, must be such that the mutual relationship of the resistances of the resistors is all the time accurately maintained. This can only be done if the resistors are sufficiently stable during all of the time period when the circuit is used, i.e. if the resistances of the resistors maintain a sufficient constancy during all of this time period.

Previously known methods for influencing and particularly improving the long term stability of polysilicon resistors are described in the following documents: M. Rydberg and U. Smith, "Electrical Properties of Compensation-Doped Polysilicon Resistors", May 1998, sent to IEEE Trans. Electron Devices, M. Rydberg and U. Smith, "The Effect of Fluorine on the Electrical Properties of Polysilicon IC-Resistors", May 1998, sent to IEEE Trans. Electron Devices, M. Rydberg and U. Smith, "Improvement of the long-term stability of polysilicon integrated circuit resistors by fluorine doping", Mat. Res. Symp. Proc. Vol. 472, (1997), M. Rydberg, U. Smith, A. Söderbärg and H. Hansson, "Compensation doping of polysilicon films for stable integrated circuit resistors", Diffusion-and-Defect-Data-Part-B-(Solid-State-Phenomena), Vol. 51–52, pp. 561–566 (1996), the published International patent application WO 97/49103 which has inventors U. Smith and M. Rydberg and discloses a polysilicon resistor having a high long term stability resulting from a high doping with fluorine, and finally the published International patent application WO 97/10606 which has inventors U. Smith, M. Rydberg and H. Hansson and discloses a polysilicon resistor having an increased stability of its resistance because of such a high concentration of donors that charge carrier traps are blocked at the grain boundaries.

In U.S. Pat. No. 5,212,108 for M. S. Liu, G. A. Shaw and J. Yue, "Fabrication of stabilized polysilicon resistors for SEU control" stabilisation of resistors between and within different manufacturing batches is described. This patent is thus concerned with the statistical spread of resistance values in the manufacturing process whereas the problem discussed herein relates to the change of the resistance values in time.

In applications in which polysilicon resistors are used in critical portions of electronic circuits, the insufficient stability of the resistors is a known practical problem. The fact is that the resistors can, when being used, in an unforeseeable way change their resistance values. Such deviations from the value set by the designer, as well as deviations between the resistance values of resistors matched to each other, can jeopardize the operation of the electronic circuit in which such resistors are included. The cause of the instability is to search for in the unsaturated bonds existing in the grain boundaries in the material. The unsaturated bonds are formed in the boundaries between the individual monocrystalline grains in the polycrystalline material due to the fact that the periodic ordering of the silicon atoms in the shape of a crystal lattice does not exist there. The outermost silicon atoms in a monocrystalline grain therefore have not sufficiently many silicon atoms as close neighbours in order to be capable of forming the four bonds which are characteristic of the lattice of silicon crystals. The resulting unsaturated bonds act as traps for charge carriers and thereby bind charges to the grain boundaries what influences the capability of the material to transport charge carriers and thereby the resistivity of the material.

If the number of bonded charges would remain constant during the manufacture of the resistors and during all of the time when the resistor is used, no problems in regard of the stability of the resistors would exist. However, the number of traps can decrease if individual atoms can migrate to the grain boundaries and be attached to the unsaturated bonds and thereby prevent them from continuing to work as traps for the charge carriers. In the same way the number of traps can increase in the case where the atoms leave their positions at the grain boundaries and then each one leave a remaining unsaturated bond.

It is known that the unsaturated bonds can be blocked by hydrogen atoms in the grain boundary. Hydrogen can exist in a high concentration in layers deposited on a circuit containing a polysilicon resistor, for example in passivation layers of silicon dioxide and/or silicon nitride, what results from the special production thereof. The hydrogen atoms react with the unsaturated bonds in the polysilicon resistor and block them so that they cannot continue to work as traps. However, a problem associated with hydrogen atoms which have been bonded to the unsaturated bonds is that the bonding strength between hydrogen and silicon is low compared to for example the mutual bond between silicon atoms. The bonds between silicon and hydrogen can therefore be easily broken whereby the unsaturated bonds are again exposed. Since unsaturated bonds capture charge carriers this will result in that the value of the resistivity is changed. To the extent that the causes of the bonds being broken are known, they can be referred to a general increase of the temperature or to local temperature variations caused by an increased power production in critical points in the resistor. However, it can not be excluded that the bonds can also be broken because of kinetic or quantum-mechanical effects caused by the transport of charge carriers through the resistor.

Though the capability of the hydrogen atoms to block unsaturated bonds is what is primarily discussed in literature, it cannot be excluded that other atoms which happen to be placed in a grain boundary or leaves it in the manufacturing process and in the use of the resistor cause similar effects, if they have not the capability of being sufficiently strongly bonded to the silicon atoms of the grain boundary. Without indicating here the magnitude of the influence, it can be mentioned that it is also possible that dopant atoms which when using the resistor interact with the grain boundaries in a dynamic way can have the same influence on the resistivity as the hydrogen atoms. In the same way it cannot be excluded that also other kinds of atoms and unintentionally added impurities included in the resistor and/or in the circuit plate, of which the resistor normally is a part, can have the same influence.

SUMMARY OF THE INVENTION

It is an object of the invention to provide polysilicon resistors having a good long term stability, i.e. having a good constancy of their resistances, which in. a safe way can be used particularly in sensitive electronic circuits such as circuits of analog type, intended for example for measurements or intended to be part of sensors, in which the resistance values of the resistors for example included in amplifier circuits directly influence an output signal representing a measured value.

The solution of the problem presented above associated with a in some cases lacking or insufficient stability of polysilicon resistors is to arrange one or more stabilising layers or blocking layers at the very part of the resistors, which defines the resistances thereof. It has appeared that a stabilisation is obtained if it is ensured both that the polysilicon resistor is protected by blocking layers or diffusion preventing layers, in particular one or more oxide based blocking layer produced from transition metals having suitable thicknesses, which are capable of preventing movable kinds of atoms, such as for example hydrogen, from reaching the unsaturated bonds in the polysilicon, and that the added material does not influence and remove the effect of possible other optimizing treatments of the polysilicon resistors, for example such treatments which in themselves result in an increased stability, and that the added blocking layer is compatible with the remaining manufacturing process of the electronic circuit. The blocking layers can be located between the resistor and other layers in the complete resistor structure, such as between the resistor body and passivation layers of typically oxide or nitride or between the resistor body and other layers containing oxides or nitrides, particularly between the resistor body and such layers, which owing to their method of production contain hydrogen atoms. The blocking layers can be located on either side of the usually plate-shaped resistor or on both sides thereof and thus enclose it. The resistor can have a resistance defining part, the resistor part, and connection regions, which together with the resistor part forms the resistor body.

The transition metals preferably include titanium and tungsten. The fact that the diffusion of hydrogen through a $TiO_2$-layer is restricted is described in Su-II Pyun and Young-Ci-Yoon, "Hydrogen permeation through PECVD-TiO/sub 2/film/Pd bilayer by AC-impedance and modulation method", Advances in Inorganic Films and Coatings, Proceedings of Topical Symposium 1 on Advances in Inorganic Films and Coatings of the 8th CIMTEC-World Ceramics Congress and Forum on New Materials. TECHNA, Faenza, Italy, 1995, pp. 485–96. The fact that layers which contain titanium and tungsten, such as a Ti30W70-film, see the discussion hereinafter, can be given improved diffusion blocking properties owing to among other things oxide layers at their surfaces is disclosed in R. S. Nowicki et al., "Studies of the Ti-W/Au Metallization on Aluminium", Thin Solid Films, 53 (1978) pp. 195–205, and S. Berger et al., "On the microstructure, composition and electrical properties of Al/TiW/poly-Si system", Applied Surface Science 48/49 (1991), pp. 281–287. In U.S. Pat. No. 5,674,759, "Method for manufacturing semiconductor device for enhancing hydrogenation effect", for Byung-Hoo Jung a method of manufacture of TFTs and MOSFETs is disclosed. The diffusion of hydrogen out of a plasma-nitride layer is prevented if on top of the nitride layer a layer of "a material having a low hydrogen diffusion coefficient, or a refractory metal" is applied. An overview of the oxides of the transition metals and their interaction with hydrogen atoms can in addition be found in C. G. Granqvist, "Handbook of Inorganic Electrochromic Materials", Elsevier 1995.

Though, in the present state of the art, it is not possible to demonstrate by an analysis, there are reasons to suppose that the oxide based blocking layers obtain their stabilising properties owing to the fact that they have an unordered structure including defects in the structure, which have a capability of binding hydrogen atoms and/or impeding the movements thereof through the layer.

BRIEF DESCRIPTION OF THE DRAWINGS

The invention will now be described in more detail with reference to non-limiting embodiments and with reference to the accompanying drawings in which.

DESCRIPTION OF PREFERRED EMBODIMENTS

Figure 1A:
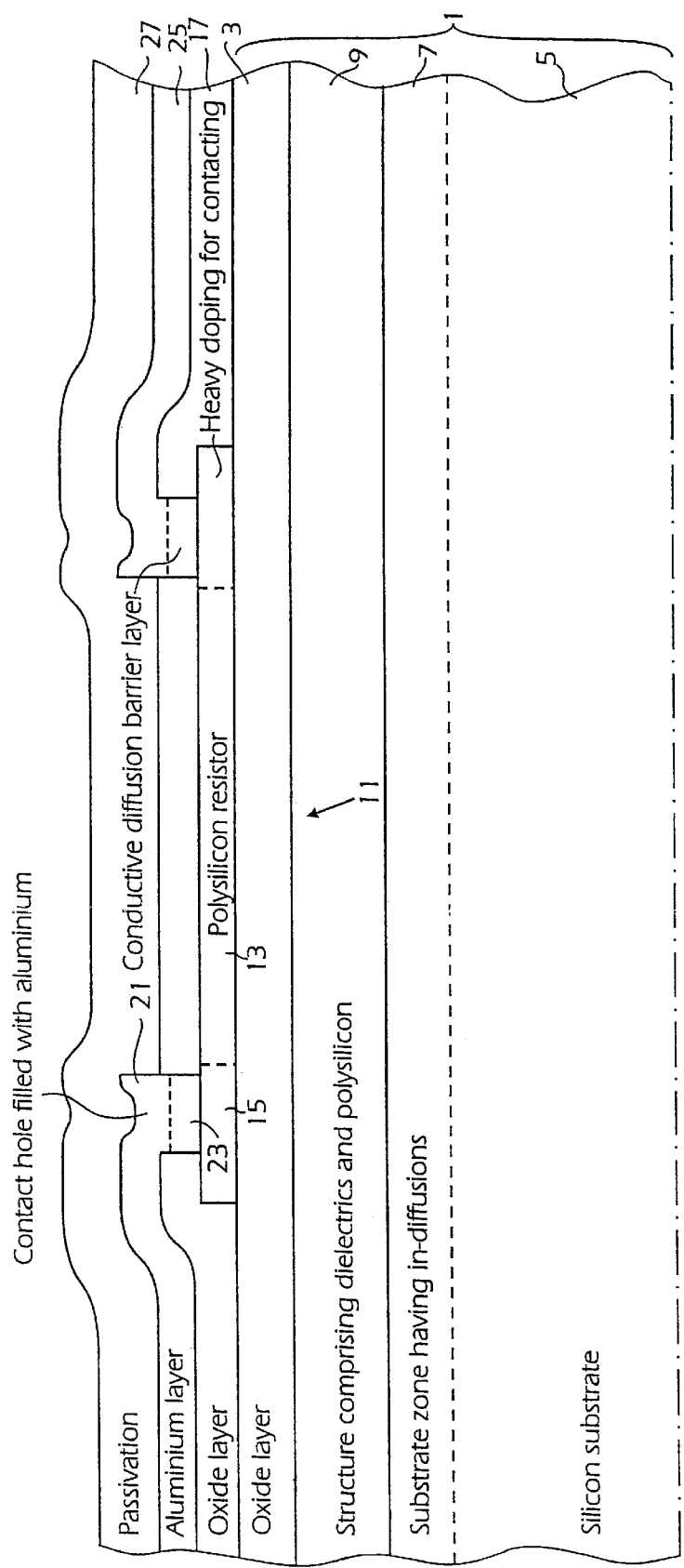
FIG. 1a is a schematic picture of a cross-section of a previously known resistor manufactured from polycrystalline silicon, in which some possible further top layers comprising for example other integrated components and more passivation layers are omitted.

I FIG. 1a an example of a cross-section of a conventional polysilicon resistor is illustrated. It has been formed on a base structure 1, which can contain integrated components and at the top has an isolating layer 3 of silicon oxide, which for example is thermal oxide but which of course also can be deposited. In the embodiment shown at the bottom in the base structure 1 a silicon substrate 5 is provided, for example a monocrystalline silicon plate, on top of it a silicon substrate zone 7 having different regions of substances diffused into it, thereon a layer structure 9 including in the typical case dielectric materials and polysilicon and at the top of it all the oxide layer 3. On the oxide layer 3 the very platform or "mesa" 11 is located which forms the resistor body and which as seen from above has for example a rectangular shape, see also the view from above of the very resistor body in FIG. 2. The resistor body 11 comprises an interior part or intermediate part 13, which is the part, the resistor part, which defines the resistance of the resistor, and exterior regions 15 for contacting, which can be very heavily doped and thereby have rather small resistances.

The upper surface of the assembly of base structure 1 and resistor body 11 is covered with a silicon oxide layer 17. However, it is possible to arrange on top of the assembly further layers comprising passive or active electric and electronic devices. A passivation layer 27 consisting of either siliconnitride or silicon dioxide respectively, or the two of these substances, can be provided at the top of the structure. Holes 21 are made through the oxide layer 17 down to the upper surface of the contacting regions 15. At the surface of the contacting regions 15 inside the holes 21 regions 23 are provided for even more enhancing the contact with conducting paths 25 of aluminium for the electric connection of the resistors which are located between the oxide layer 17 and the passivation layer 27. The regions 23 can include conducting diffusion barrier layers of for example titanium or some titanium compound.

The manufacture of polysilicon resistors in the conventional way will now be described with reference to detailed examples. The resistances of the resistors are defined by doping with boron.

EXAMPLE 1

Polycrystalline silicon films having a thickness of 5500 Å were deposited according to a known CVD-method (CVD= "Chemical Vapour Deposition") on thermal silicon dioxide having the thickness of 9000 Å, which had previously been applied to a suitable substrate. On top of the polysilicon film about 5500 Å thick silicon dioxide was deposited using CVD. Thereupon an annealing operation was performed at 1050° C. during 30 minutes in order to among other things define the grain size of the polysilicon. The polysilicon surface was etched to be free from oxide, whereupon boron was implanted to a concentration of $9.4 \times 10^{18}$ cm$^{-3}$ in the film at an energy of 80 keV. Thereupon a lithographically defined mask was placed on the polysilicon and an etching was made to produce the resistors. After this silicon dioxide was deposited to a thickness of 6500 Å at 400° C. using CVD, followed by an annealing operation at 1000° C. during about 30 minutes. This was followed by a processing flow normally used in the manufacture of integrated electronic circuits including contact hole etching, aluminium metallisation, lithographic definition of conductor paths, alloying in hydrogen gas at 420° C. during 20 minutes, and passivation with 9000 Å thick silicon nitride. The latter layer was produced using plasma enhanced CVD. The resistors had a length of 200 μm and a width of 20 μm. The polycrystalline film in the finished resistors had a resistivity of 605 ohms/square.

Figure 3:
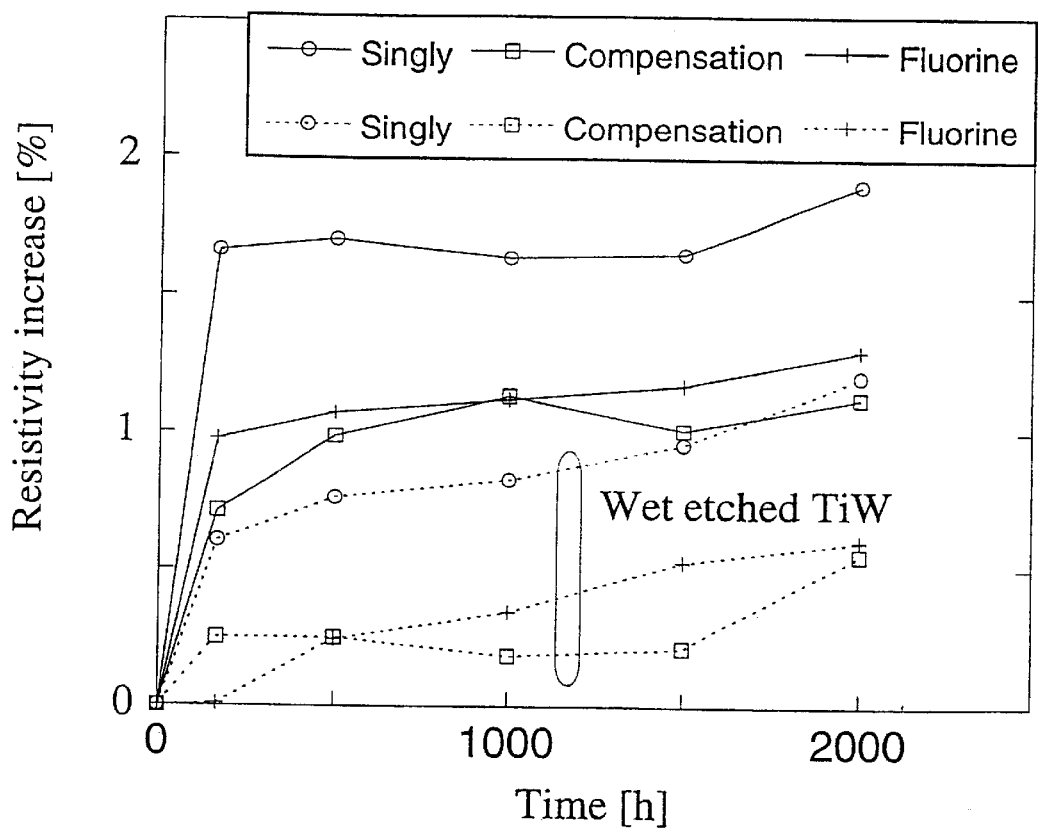
FIG. 3 is a graph of the results of load tests of resistors, which have been manufactured from polycrystalline silicon and which lack and have respectively stabilising layers.

The resistors were mounted in hermetic ceramic capsules and were then subjected to tests at 100° C. and 150° C. during a period of 2000 hours, both without and with an applied load voltage of 30 V, the resistances of the produced resistors being measured at ambient temperature after 0, 168, 500 and 1000, 1500 and 2000 hours. The result is shown as a solid curve indicated by "Singly" in FIG. 3. As appears from the figure, the resistances of these resistors can increase by up to about 2% compared to the resistance value at the start of the test. This is too much for analog resistors in critical applications. The example thereby illustrates the described problem associated with the fact that polycrystalline silicon which has been doped only with boron does not give sufficiently stable resistors.

EXAMPLE 2

Resistors were produced according to the method, which is described in the above cited International patent application WO 97/49103.

In polycrystalline silicon films, produced according to example 1, boron was implanted to a concentration in the film of $9.4 \times 10^{8}$ cm$^{-3}$ at 80 keV. On top of the polysilicon films silicon dioxide having a thickness of about 5500 Å was deposited using CVD. The films were then annealed at 1000° C. during 30 minutes. The polysilicon surface was etched to be free of oxide, whereafter fluorine was implanted to a concentration in the film of $5.7 \times 10^{19}$ cm$^{-3}$ at an energy of 120 keV. Thereupon a lithographically defined mask was placed on the polysilicon and an etching was made to produce the resistors. After this silicon dioxide was deposited having a thickness of 6500 Å at 400° C. using CVD, followed by an annealing at 750° C. during 30 minutes. This was followed by a processing flow normally used in the manufacture of integrated electronic circuits including contact hole etching, aluminium metallisation, lithographic definition of conductor paths, alloying in hydrogen gas at 420° C. during 20 minutes, and passivation with 9000 Å thick silicon nitride. The latter layer was produced using plasma enhanced CVD. The resistors had a length of 200 μm and a width of 20 μm. The polycrystalline film in the finished resistors had a resistivity of 650–700 ohms/square.

The resistors were mounted in ceramic capsules and were then subjected to aging tests and load tests at 100° and 150° C. during a time period of 2000 hours, the resistances of the manufactured resistors being measured at ambient temperature after 0, 168, 500 and 1000, 1500 and 2000 hours. The result is illustrated as a solid curve indicated by "Fluorine" in FIG. 3. As appears from the figure, the resistances of these resistors increased by about 1%. This demonstrates how a stabilising effect can be obtained when the already known method comprising stabilising with a high concentration of fluorine is used. However, a further improvement of the stability is often desirable.

EXAMPLE 3

Resistors were produced according to the method, which is described in the above cited International patent application WO 97/10606.

On polycrystalline silicon films, produced according to example 1, boron was implanted to a concentration of $7.5 \times 10^{19}$ cm$^{-3}$ at 80 keV, followed by implanting phosphorus to a dose of $13.6 \times 10^{19}$ cm$^{-3}$ at 120 keV. From the obtained polysilicon film resistors were then produced according to example 1. The resistors had a length of 200 μm and a width of 20 μm. The polycrystalline film in the finished resistors was p-type and had a resistivity of 1020 ohms/square.

The resistors were mounted in ceramic capsules and were then subjected to load tests at 100° and 150° C. up to 2000 hours, the resistances of the produced resistors being measured at ambient temperature after 0, 168, 500 and 1000, 1500 and 2000 hours. The result is illustrated as a solid curve indicated by "Compensation" in FIG. 3. As appears from the figure, the resistances of these resistors increased by about 1%. This illustrates, how a stabilising effect can be obtained using the previously known method comprising a compensation-doping. However, a further improvement of the stability is often desirable.

However, it appears that the stability of polysilicon resistors according to the discussion above which is not always sufficient, i.e. the variation of the resistances of such resistors during a long time and/or when loaded by electric currents, can be achieved by at least one suitably selected stabilising layer or blocking layer, which is supposed to reduce diffusion of primarily hydrogen atoms. More particularly, in order to stabilise a polysilicon resistor it should be protected by one or more oxide based blocking layers produced from suitable transition metals, having suitable thicknesses and arranged at the resistor. These layers are selected to prevent movable kinds of atoms such as for example hydrogen from reaching the unsaturated bonds in the resistor polysilicon. The added material should not influence or suppress the effect of possible other optimizing treatments of the polysilicon resistors, for example such treatments which in themselves result in increased stability such as a suitably high fluorine doping and a compensation doping according to the discussion above. The added blocking layer must of course be compatible with the remaining manufacturing steps of the electronic circuit.

Figure 1B:
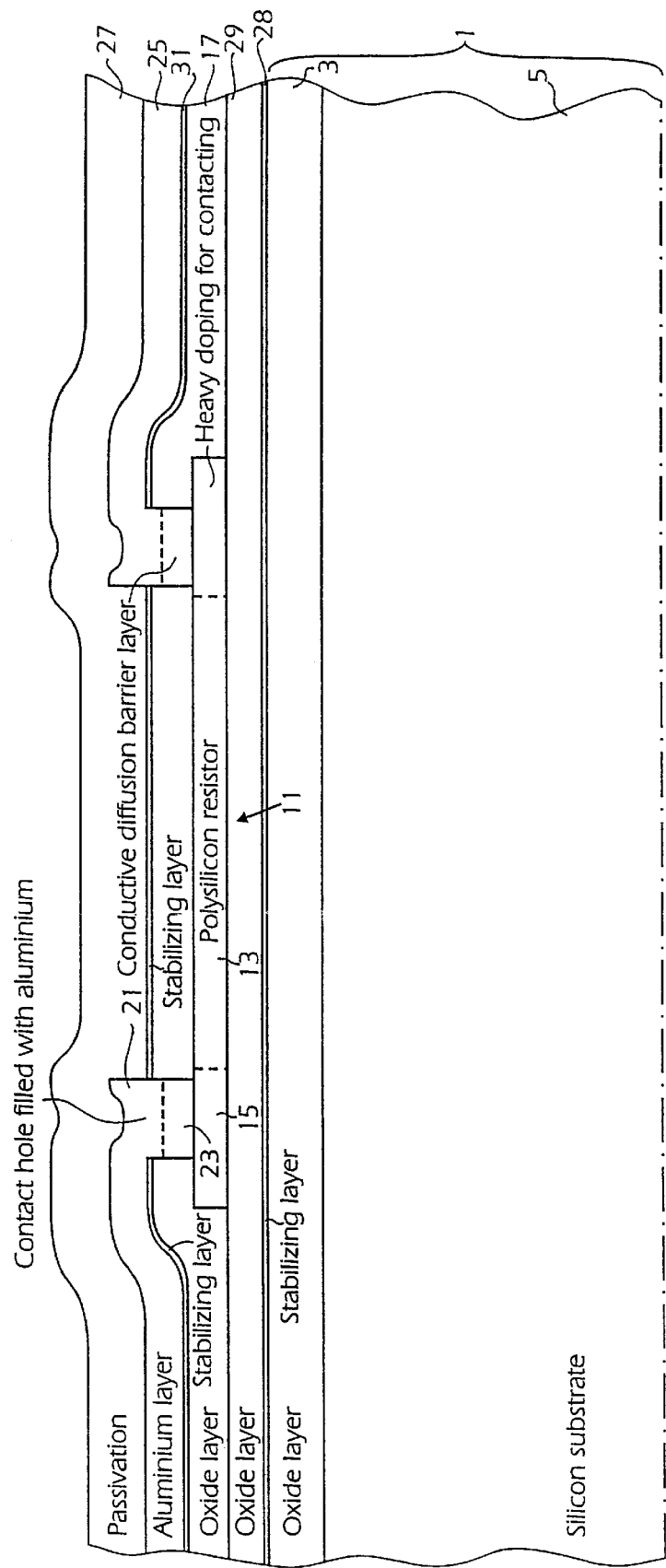
FIG. 1b is a schematic picture similar to FIG. 1a of a cross-section of a resistor manufactured from polycrystalline silicon and having added stabilising blocking layers.

In FIG. 1b a cross-section of a polysilicon resistor stabilised in this way is illustrated. It has a structure similar to the conventional resistor according to FIG. 1a but has stabilising layers, two possible positions of which are shown. In FIG. 1b all the other layers which are typical of an integrated circuit are not shown which can be located above or under the very resistor structure. Neither have circuit elements been drawn which can be provided in the silicon-substrate, compare however FIG. 1a. Thus, the stabilised polysilicon resistor is built on a base structure 1, which can contain integrated components and at its top has an isolating layer 3 of silicon oxide. Under the silicon oxide layer 3 the silicon substrate 5 is located. Directly on top of the oxide layer 3 a first stabilising layer 28 can be located and on top thereof an oxide layer 29 followed by the elevated portion 11, which forms the resistor body. The resistor body 11 comprises as above an interior part 13, the resistor part, which defines the resistance of the resistor, and exterior regions 15 for electrical contacting.

The top surface of the assembly comprising base structure 1 and resistor body 11 is covered with a silicon oxide layer 17. This silicon oxide layer 17 is covered with a metal layer 31 based on transition metals, preferably Ti and W, which within regions, in which it is not covered by the aluminium layer 25 is transformed to a second stabilising layer 33. The upper stabilising layer 33 is located at least on top of the very resistor part 13 but can cover the major portion of the resistor body 11, except for some areas covered with the aluminium layer 25 which are located at the edges. Holes 21 are made through the transition metal layer 31 and the oxide layer 17 down to the upper surface of the contacting regions 15 and are filled with material from the aluminium layer 25. At the surface of the contacting regions 15 inside the holes 21 as above regions 23 are provided for further improving the electric contact with electric conductor paths comprised in the aluminium layer 25 for the electric connection of the resistor. A passivation layer 27 of for example silicon nitride or silicon dioxide or of these two substances together cover the whole structure.

Figure 2:
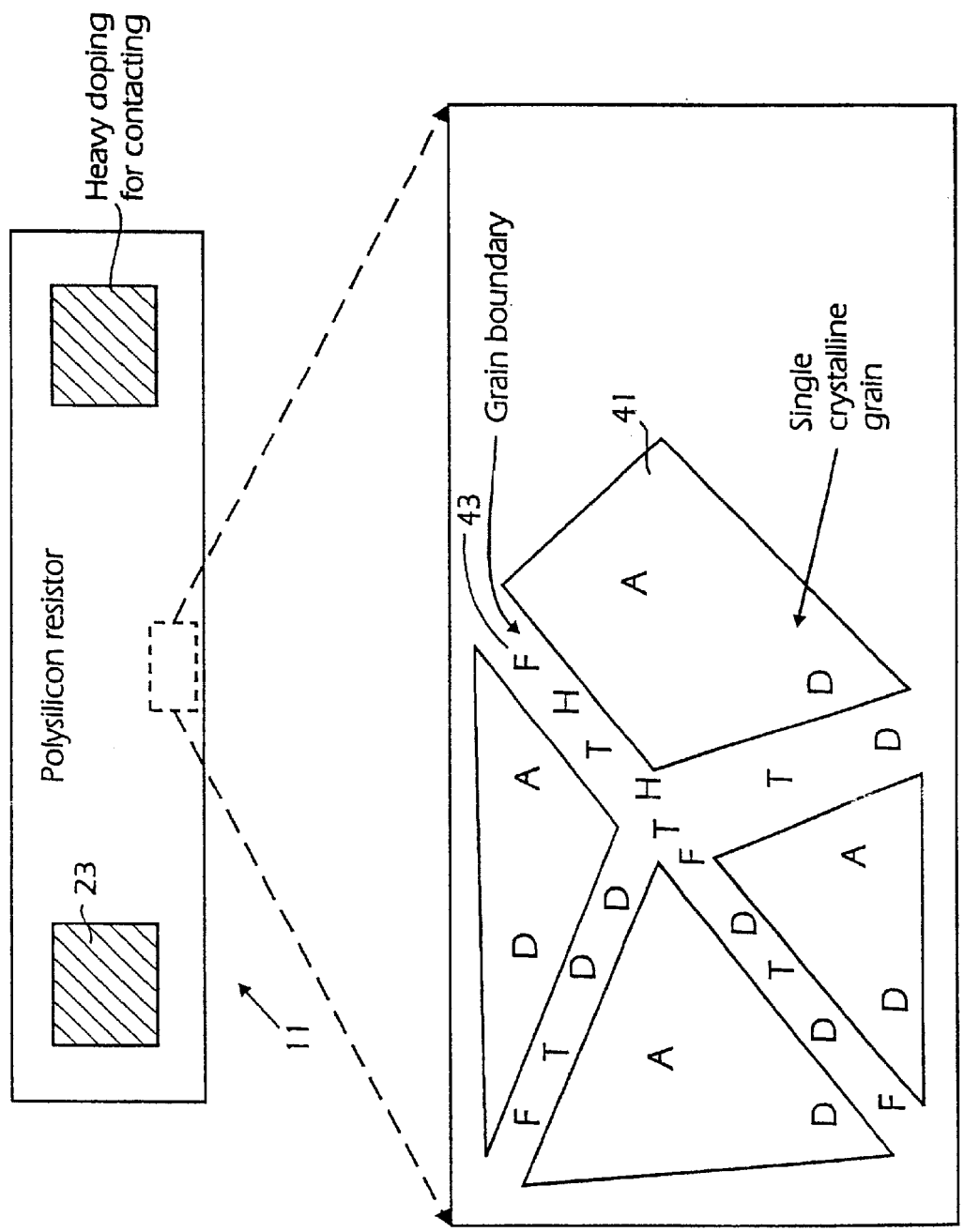
FIG. 2 is a highly magnified view of a portion of a region doped with fluorine of a resistor as seen from above.

In FIG. 2 is illustrated, in a strongly magnified partial view, a very schematic picture of a small area of a polysilicon resistor. Therefrom appears how acceptor atoms A and/or donor atoms D, charge carrier traps T and possible hydrogen atoms H are distributed inside grains 41 and in grain boundaries 43 respectively. Possibly also fluorine atoms F may exist or alternatively only fluorine atoms and no hydrogen atoms. For possible fluorine atoms and hydrogen atoms influencing the resistivity of the polysilicon films, they are located primarily in the grain boundaries.

Hereinafter detailed examples of polysilicon resistors having stabilising blocking layers will be described.

EXAMPLE 4

Polysilicon resistors were produced according to example 1 but including the difference, that before the deposition of the aluminium film a 1500 Å thick film was deposited by sputtering, the film being of an alloy which is common in the manufacture of integrated electronic circuits and is of titanium and tungsten having the composition formula Ti30W70, where the FIGS. 30 and 70 indicate the atomic composition, i.e. the alloy contains 30 atom percent titan and 70 atom percent tungsten. Thereafter the aluminium metallisation was deposited. The aluminium conductors were lithographically defined after which the aluminium conductors produced in the etching operation were used as a mask at a transformation of the metallic Ti30W70-layer to an oxide based blocking layer at any place where it was exposed under the aluminium conductors. For this transformation a 30%(weight) water solution of hydrogen peroxide at ambient temperature was used, in which the circuit plates were immersed during 30 minutes. Thereupon the plates were rinsed in deionized water during 15 minutes. After this the normal process flow according to example 1 was continued. The polysilicon resistors thus had a structure corresponding to the structure illustrated in FIG. 1*b*but without the first, lower stabilising layer 28 and the oxide layer 29 located directly on top of it. The resistors had a length of 200 μm and a width of 20 μm. The polycrystalline film in the finished resistors hade a resistivity which considering measurement errors and spread corresponded to the resistivity of resistors manufactured according to example 1.

The transformation of titanium and tungsten to oxides when treated with hydrogen peroxide $H_2O_2$ is described in J. E. A. M. van-den-Meerakker, M. Scholten and J. J. van-Oekel "The Etching of Ti-W in Concentrated $H_2O_2$ Solutions", Thin Solid Films, Vol. 208, pp. 237–42 (1992), and J. E. A. M. van-den-Meerakker, M. Scholten and T. L. G. M. Thijssen, "An Electrandemical and X-Ray Photoelectron Spectroscopic Study into the Mechanism of Ti+W Alloy Etching in $H_2O_2$ Solutions", Journal of Electroanalytical Chemistry, Vol. 333, pp. 205–216 (1992). This transformation can be considered as an etching operation since most of the metals disappears in a treatment with a hydrogen peroxide solution. After the etching process an oxide based layer remains, which can be thin and has a thickness of probably at most a few hundred Å.

It can in this context be mentioned, that the metal alloy of titanium and tungsten in the above given example is often used as an intermediate layer in the manufacture of integrated circuits in order to achieve a resistive electrical contact between aluminium and silicon of n-type, in contrast with the rectifying contact, which is obtained when aluminium is located in a direct contact with silicon of n-type.

In the same way as in example 1 the resistors were mounted in ceramic capsules and were then subjected to load tests at 100° and 150° C. up to 2000 hours, the resistances of the manufactured resistors being measured at ambient temperature after 0, 168, 500 and 1000, 1500 and 2000 hours. The result is illustrated as a dashed curve indicated by "Singly" in FIG. 3. As appears from the figure, the resistance of the resistors increased by approximately half the resistance change of polysilicon films, which have not been protected by a TiW-oxide based blocking layer and the resistances of which are illustrated by the solid curve indicated by "Singly" in FIG. 3. This illustrates the stabilising effect obtained in the case where the resistors are manufactured according to this example.

Figure 4:
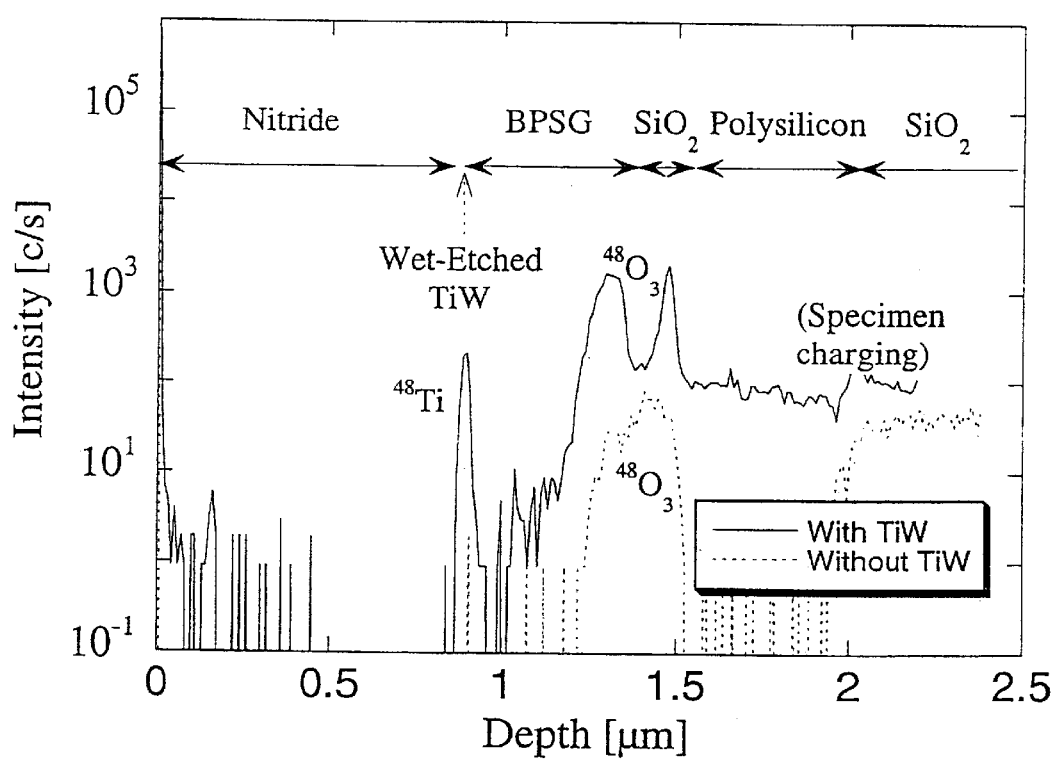
FIGS. 4 and 5 are graphs of the results of SIMS-analysis (SIMS="Secondary Ion Mass Spectroscopy") of an oxide based blocking layer of stabilised resistors.

For some resistors an analysis of the layers was made using the highly sensitive surface analysis method SIMS ("Secondary Ion Mass Spectroscopy"). As appears from FIG. 4, a distinct titanium signal was obtained in the boundary surface between nitride and BPSG (a boron and phosphorus doped silicon dioxide), i.e. at the location of the oxide basad blocking layer. The ion radiation necessary for the analysis resulted in that the surface of the sample was charged what affected the appearance of the signals.

EXAMPLE 5

Polysilicon resistors were produced according to example 2 but including the difference that before the deposition of the aluminium film a 1500 Å thick metal film was deposited using sputtering, the film having the composition formula Ti30W70, where the figures indicate the atomic composition. Thereafter the aluminium metallisation was applied. The aluminium conductors were lithographically defined, whereafter the aluminium conductors produced by the etching process were used as a mask in the transformation of the metallic Ti30W70-layers to an oxide based blocking layer in the same way as in example 4 at any place where it was exposed under the aluminium conductors. After this the normal process flow was continued according to example 2. The polysilicon resistors had as in example 4 a structure corresponding to the structure illustrated in FIG. 1b but without the first, lower stabilising layer 28 and the oxide layer 29 located directly on top thereof. The resistors had a length of 200 μm and a width of 20 μm. The polycrystalline film in the finished resistors had a resistivity, which considering measurement errors and spread corresponded to the resistivity of resistors manufactured according to example 2.

In the same way as in example 2 the resistors were mounted in ceramic capsules and were then subjected to load tests at 100° and 150° C. up to 2000 hours, the resistances being measured at ambient temperature after 0, 168, 500 and 1000, 1500 and 2000 hours. The result is illustrated as a dashed curve indicated by "Fluorine" in FIG. 3. As appears from the figure, the resistances of the resistors increased by less than half the resistance change of polysilicon films, which are not protected by a TiW-oxide based blocking layer and for which the resistances are illustrated by the solid curve indicated by "Fluorine" in FIG. 3. This illustrates the stabilising effect, which is obtained in the case where the resistors are manufactured having stabilising layers.

EXAMPLE 6

Polysilicon resistors were produced according to example 3 but including the difference that before applying the aluminium film a 1500 Å thick metal film was deposited using sputtering with the composition formula Ti30W70, where the figures indicate the atomic composition. Thereafter the aluminium metallisation was applied. The aluminium conductors were lithographically defined whereafter the aluminium conductors produced by the etching process were used as a mask in the transformation of the metallic Ti30W70-layer to an oxide based blocking layer in the same way as in example 4 at any place where it was exposed underneath the aluminium conductors. After this the normal process flow according to example 3 was continued. The polysilicon resistors had as in example 4 a structure corresponding to the structure illustrated in FIG. 1b but without the first, lower stabilising layer 28 and the oxide layer 29 located directly on top thereof. The resistors had a length of 200 μm and a width of 20 μm. The polycrystalline film in the finished resistors had a resistivity, which considering measurement errors and spread corresponded to the resistivity of resistors manufactured according to example 3.

In the same way as in example 3 the resistors were mounted in ceramic capsules and were then subjected to load tests at 100° and 150° C. up to 2000 hours, the resistances being measured at ambient temperature after 0, 168, 500 and 1000, 1500 and 2000 hours. The result is illustrated as a dashed curve indicated by "Compensation" in FIG. 3. As appears from the figure, the resistances of the resistors increased by less than half the resistance change of polysilicon films, which are not protected by the TiW-oxide based blocking layer and for which the resistances are illustrated by the solid curve indicated by "Compensation" in FIG. 3. This illustrates the stabilising effect, which is obtained in the case where the resistors are manufactured having stabilising layers.

EXAMPLE 7

Polysilicon resistors were produced according to example 4, but with the difference that after the silicon substrate had been provided with a 9000 Å thick layer of thermal silicon dioxide, a 1500 Å thick film of Ti30W70 was deposited. The latter film was transformed to an oxide based blocking layer in the same way as the corresponding layer in example 4. On top of the blocking layer about 5500 Å silicon dioxide was deposited using CVD. Then the production of the layers and the manufacture of the resistor was then continued exactly as in example 4.

The produced resistors thus differ from those according to example 4 by having also an oxide based blocking layer and a CVD-oxide layer under the polysilicon film, i.e. they have all the layers illustrated in FIG. 1b. The polysilicon film, which forms the resistor body, is thus enclosed between two silicon dioxide layers, i.e. between two oxide layers based on the ground material in the resistor body, which are direct neighbours of the resistor body, and outside these oxide layers two oxide based blocking layers.

The resistors were mounted, were subjected to load tests and the resistance increase was measured according to example 4. Within the experimental accuracy no resistance increase could be observed.

EXAMPLE 8

Doped polycrystalline films were produced according to example 1. The polysilicon films were then covered with a silicon dioxide according to example 1. In the same way as in example 4 a 1500 Å thick metal film of titanium and tungsten was then deposited using sputtering having the composition formula Ti30W70, where the figures indicate the atomic composition. The metallic Ti30W70-layer was then transformed to an oxide based blocking layer. Therefor a 30% water solution of hydrogen peroxide was used at ambient temperature, in which the circuit plates remained during 30 minutes. Thereafter the plates were rinsed in deionised water during 15 minutes.

Figure 5:
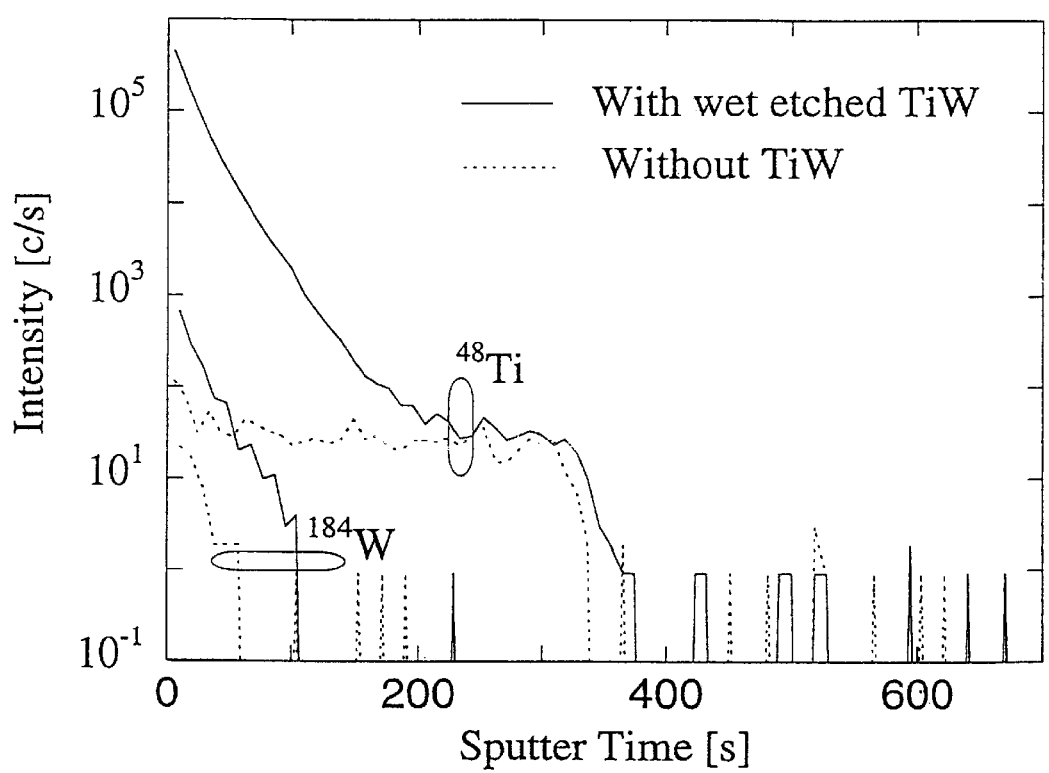

Samples were taken of the plates and the outermost layer was analyzed in regard of existence of titanium and tungsten using the highly sensitive surface analysis method SIMS. As a comparison samples were also taken which had been subjected to the same treatment with the exception that the manufacture had been interrupted just before the Ti30W70-film was to be deposited. As appears from FIG. 5, a distinct difference in the intensity of the titanium and tungsten signals in samples having wet etched Ti30W70 compared to samples having no Ti30W70 was obtained. The signal levels of the latter samples are to be assigned to signal noise and to the fact, that the SIMS signal from. a titanium atom having the mass number 48 coincides with the signal from agglomerates which have the same mass number and are formed by three oxygen atoms.

Figure 6:
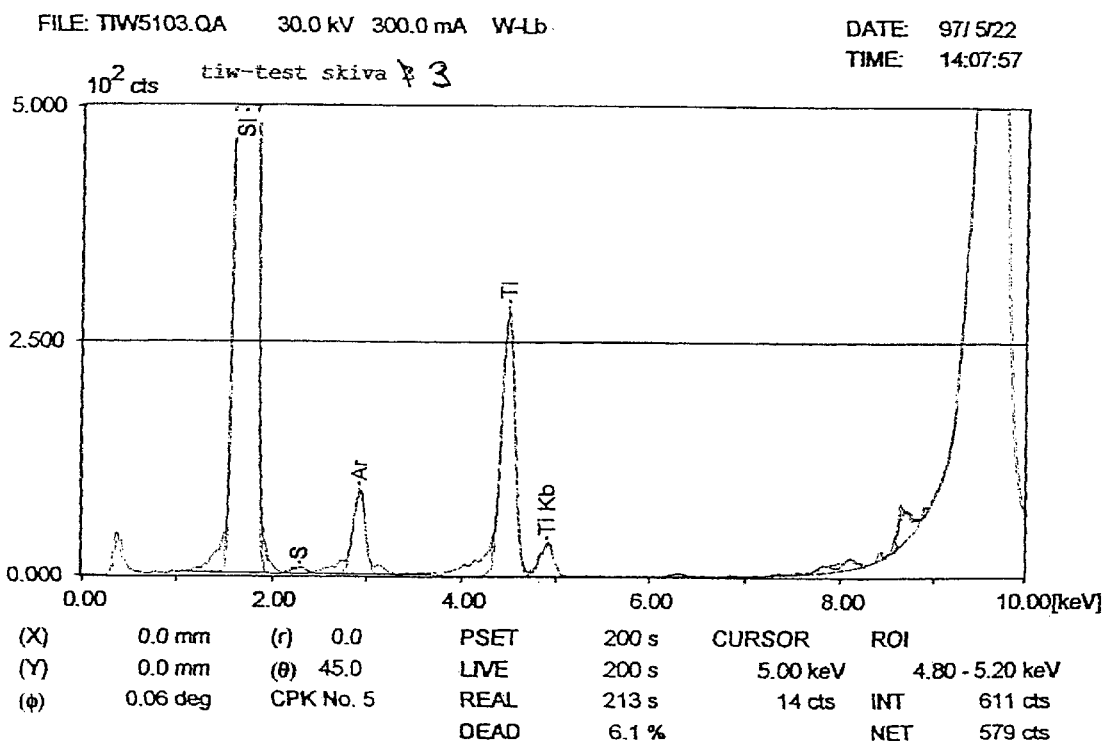
FIGS. 6 and 7 are graphs of the results of TXRF-analysis (TXRF="Total X-Ray Fluorescence") of an oxide based blocking layer of stabilised resistors.

Samples were also taken of the plates in which the outermost layer was analyzed in regard of existence of titanium using the highly sensitive surface analysis method TXRF ("Total X-Ray Fluorescence"). As appears from the titanium line in FIG. 6, the oxide based blocking layer on the sample surface contains titanium. The intensity of the titanium signal corresponds to a surface concentration of $5 \times 10^{12}$ cm$^{-2}$. Since a tungsten cathode was used to generate the X-ray radiation needed for the analysis the tungsten lines cannot be used for demonstrating existence of tungsten in the film. Samples were also taken of the plates in which the outermost layer was analyzed in regard of existence of both titanium and tungsten using the highly sensitive layer analysis method RBS ("Rutherford Backscattering Spectroscopy"). As appears from Table 1, see sample 1, the results demonstrate, that the oxide based blocking layers on the sample surface contains both titanium and tungsten. Since the three analysis methods SIMS, TXRF and RBS were performed at different facilities, it was not possible to make a mutual calibration of the apparatuses used and the obtained measured values.

EXAMPLE 9

Doped polycrystalline films were covered with an oxide layer, an aluminium layer and a Ti30W70-oxide based layer according to example 4. The aluminium layer was etched away in the same way as in example 1. After the aluminium film had been removed the Ti30W70-layer was transformed to an oxide based blocking layer in the same way as in example 8.

Figure 7:
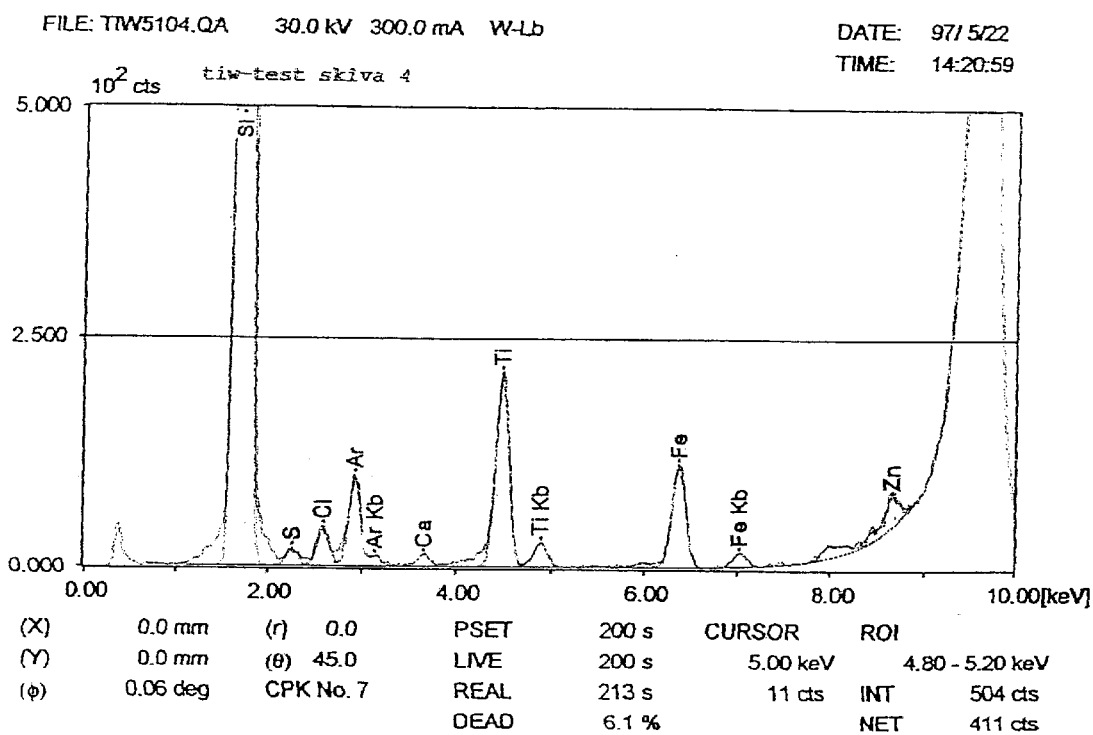

Samples were taken of the plates and the outermost layer was analyzed in regard of existence of titanium using TXRF. As appears from the titanium line in FIG. 7, the oxide-based blocking layer on the sample surface contains titanium. The intensity of the titanium signal corresponds to a surface concentration of $4 \times 10^{12}$ cm$^{-2}$. Since a tungsten cathode has been used to generate the X-ray radiation necessary for the analysis the tungsten lines cannot be used to demonstrate the existence of tungsten in the film. Samples were also taken of the plates in which the outermost layer was analyzed in regard of existence of both titanium and tungsten using RBS. As appears from table 1, the results demonstrate, see sample 2, that the oxide based blocking layer on the sample surface contains both titanium and tungsten. Since the three analysis methods SIMS, TXRF and RBS as in example 8 were performed at different facilities, it was not possible to make a mutual calibration of the apparatuses used and the obtained measured values.

TABLE 1

Ti- and W-concentration after treatment of TiW with $H_2O_2$

| Sample nr | Analysis method | Ti-concentration (atoms/cm$^2$) | W-concentration (atoms/cm$^2$) |
| --- | --- | --- | --- |
| 1 | RBS | $1 \times 10^{13}$ | $6 \times 10^{12}$ |
| 2 | RBS | $2 \times 10^{13}$ | $1 \times 10^{13}$ |

For sample No. 1 a structure having a TiW-layer on the top was etched by hydrogen peroxide. For sample No. 2 a structure having at the top an Al-layer and under it a layer of TiW was used. The Al-layer was etched away using a usual etching agent used in the manufacture of integrated circuits whereas the TiW-layer was etched using hydrogen peroxide.

As to the dopants in the polysilicon film, which determine the resistivity of the resistor, they can be selected among all usual dopants. The atom kind, more particularly boron, which has been mentioned in the examples above must not necessarily be used.

As to the kinds of atoms included in the oxide based blocking layers, other metal atoms than the metal atoms, which are mentioned in the examples above, can be used. Similar properties are obtained using oxide based blocking layers, which are produced from other kinds of atoms, alone or combined with other, as long as they are taken among the transition metals of the periodic system. Similarly, it is not necessary for achieving a stabilising effect, that the oxide formed by the metal atoms is based purely on oxygen. Admixture of other atoms, for example of the atom kinds fluorine and nitrogen, characteristic of the manufacture of integrated resistors, taken alone or combined with each other, still gives oxide based blocking layers having the intended stabilising properties.

As the blocking layers, primarily such oxide based layers are used, which are electrically isolating and thereby also can be located in a tight or direct contact with metal conductors. A deposited suitable metal layer can according to the discussion above be transformed to become oxide based only within desired regions and can otherwise act as an electric conductor. In the term oxide based layers, in addition to the primarily intended proper oxide layers or pure oxide layers, layers are also included, which contain oxygen atoms, for example in the shape of hydroxide radicals and/or water molecules. Furthermore, such metal layers are included, which are not completed transformed to oxides, but still are metals, i.e. layers, which are only "doped" with oxygen.

Similarly, the production of the oxide based blocking layers is not restricted to that mentioned in the examples, but the layers can be produced using all the physical, electro-chemical and chemical methods, which are used in the manufacture of integrated electronic circuits. For example both oxide based blocking layers, which are produced by a direct deposition, and such layers which are obtained after an oxidation of deposited metal layers, can be used in the stabilised polysilicon resistors. The thicknesses and locations of the layers are adapted to the desired degree of improvement of the stability of the resistors.

The resistors are according to the description above produced from polycrystalline films but they can generally be arbitrary type and have an arbitrary resistivity and resistance.

The resistors are according to the description above produced from of polycrystalline silicon but they can also be produced from polycrystalline germanium or polycrystalline silicon-germanium compounds.

What is claimed is:

1. A resistor comprising:
    a polycrystalline resistor body comprising a material selected among polycrystalline silicon, polycrystalline germanium and polycrystalline silicon-germanium, and
    electric contact regions arranged on and/or in the polycrystalline resistor body,
    the resistor body including a resistor part located between the electric contact regions, material in the resistor part being doped with dopants to achieve a desired electrical resistance of the resistor,
    at least one oxide based diffusion barrier layer which comprises atoms of at least one transition metal located above and/or below the resistor part, said at least one oxide based diffusion barrier layer being located at a position to stabilize resistance of the resistor.

2. The resistor of claim 1 wherein the diffusion barrier layer comprises titanium and tungsten.

3. The resistor of claim 1 further comprising a silicon oxide layer located between the resistor part and the at least one oxide based layer.

4. The resistor of claim 1 comprising a first oxide based diffusion barrier layer which comprises atoms of at least one transition metal and is located at an under side of the resistor part, the resistor further comprising a second oxide based diffusion barrier layer which comprises atoms of at least one transition metal and is located at a top side of the resistor part.

5. The resistor of claim 1 wherein the resistor part is enclosed by oxide based layers comprising atoms of at least one transition metal.

6. The resistor of claim 1 further comprising a layer of oxide of the material in the resistor part, the layer being located between the resistor part and the at least one oxide based layer comprising atoms of at least one transition metal.

7. The resistor of claim 1, wherein the diffusion barrier layer is at least 1,000 Å thick.

8. The resistor of claim 1, wherein the diffusion barrier layer is about 1,500 Å thick.

9. The resistor of claim 1, wherein the diffusion barrier layer is located so that no more than one other layer is located between the diffusion barrier layer and the resistor part of the resistor body.

10. A resistor comprising:
- a resistor body comprising a material selected among polycrystalline silicon, polycrystalline germanium and polycrystalline silicon-germanium,
- electric contact regions arranged on and/or in the resistor body,
- the resistor body including a resistor part located between the electric contact regions, material in the resistor part being doped with dopants to achieve a desired electrical resistance of the resistor,
- an oxide based diffusion preventing layer including atoms of at least one transition metal located between the resistor part and one selected among:
  - a first layer or region containing atoms which are capable of interacting with grain boundaries in the material of the resistor body to change the resistivity of the material, and
  - a passivation layer.

11. The resistor of claim 10 wherein the atoms comprise hydrogen atoms.

12. The resistor of claims 11 wherein the atoms of at least one transition metal comprise atoms selected among titanium and tungsten.

13. The resistor of claim 10 further comprising a silicon oxide layer located between the resistor part and the diffusion preventing layer.

14. The resistor of claim 10 comprising a first diffusion preventing layer located at an under side of the resistor part and a second diffusion preventing layer located at a top side of the resistor part.

15. The resistor of claim 10 further comprising a layer of oxide of the material in the resistor part, the layer being located between the resistor part and (one of) the at least one diffusion preventing layer.

16. A method of manufacturing a resistor, the method comprising:
- producing a body comprising a material selected among polycrystalline silicon, polycrystalline germanium and polycrystalline silicon-germanium,
- doping material of the body with at least one dopant to achieve a desired electrical resistance of the resistor,
- arranging electric contact regions of the body,
- forming at least one oxide based diffusion barrier layer, which comprises atoms of at least one transition metal, at the resistor body in order to help stabilize resistance of the resistor.

17. The method of claim 16 wherein in the step of applying the at least one oxide based layer the at least one oxide based layer is made to contain atoms selected among titanium and tungsten.

18. The method of claim 16 comprising the further step of applying an oxide of the material of the resistor body between the resistor body and (one of) the at least one oxide based layer.

19. The method of claim 16 wherein, in the step of arranging the at least one oxide based layer, first a layer of at least one transition metal is applied and thereafter the layer of at least one transition metal is oxidized.

20. The method of claim 19 wherein the layer of at least one transition metal is oxidized by treating the layer with hydrogen peroxide.

* * * * *